(12) United States Patent
Umei et al.

(10) Patent No.: US 7,789,696 B2
(45) Date of Patent: Sep. 7, 2010

(54) WATERPROOF CASE FOR ELECTRICAL APPARATUS

(75) Inventors: Akira Umei, Hashimoto (JP); Takayuki Tokairin, Sakado (JP)

(73) Assignee: Tamura Corporation, Tokyo (JP)

( * ) Notice: Subject to any disclaimer, the term of this patent is extended or adjusted under 35 U.S.C. 154(b) by 177 days.

(21) Appl. No.: 12/086,873

(22) PCT Filed: Mar. 28, 2007

(86) PCT No.: PCT/JP2007/056715
§ 371 (c)(1),
(2), (4) Date: Jun. 20, 2008

(87) PCT Pub. No.: WO2007/116791
PCT Pub. Date: Oct. 18, 2007

(65) Prior Publication Data
US 2010/0144194 A1    Jun. 10, 2010

(30) Foreign Application Priority Data
Mar. 28, 2006    (JP) .............................. 2006-087451

(51) Int. Cl.
*H01R 13/56* (2006.01)
(52) U.S. Cl. ..................................................... 439/447

(58) Field of Classification Search .................. 439/447, 439/455, 731, 936; 29/876
See application file for complete search history.

(56) References Cited

U.S. PATENT DOCUMENTS

| | | | |
|---|---|---|---|
| 3,786,397 A * | 1/1974 | Bridges | 439/277 |
| 6,031,213 A | 2/2000 | Hashimoto et al. | |
| 6,068,506 A * | 5/2000 | Shen | 439/447 |
| 6,232,544 B1 | 5/2001 | Yamazaki et al. | |
| 7,445,490 B2 * | 11/2008 | Jacobson | 439/465 |

FOREIGN PATENT DOCUMENTS

| | | |
|---|---|---|
| JP | 3-220795 | 9/1991 |
| JP | 8-316660 | 11/1996 |
| JP | 11-354942 | 12/1999 |
| JP | 2004-265748 | 9/2004 |

* cited by examiner

*Primary Examiner*—Phuong K Dinh
(74) *Attorney, Agent, or Firm*—Day Pitney LLP (57) ABSTRACT

A drawing part of a cable 3 in a waterproof case for an electrical apparatus is sealed. On an outer circumferential part of the cable 3, a first bushing member 2a and a second bushing member 2b are formed by injection molding to be spaced with respect to each other. A box part 35 of the waterproof case is located between the first busing member 2a and the second bushing member 2b. After locating the cable 3 in the waterproof case, a filling material 40, such as epoxy resin or urethane resin, is filled into the inside of the box part 35.

14 Claims, 11 Drawing Sheets

WATERPROOF CASE FOR ELECTRICAL APPARATUS

TECHNICAL FIELD

This invention relates to a waterproof case for an electrical apparatus, particularly to a waterproof case to be applied to an AC adapter having a cable drawing part.

BACKGROUND OF THE INVENTION

There are electrical apparatus cases having a cable or a line cord (hereafter, generically called a cable). An example of an electrical apparatus having such a case is an AC adapter. An AC adapter is an apparatus configured to convert AC power supplied as a commercial power source into DC power and supplying the DC power to an electrical device. In the inner space of the case of the AC adapter, a power source board functioning to convert the AC power to a DC current having a predetermined voltage is provided. A pair of tap edges is provided on a side wall of the case to penetrate through the side wall of the case so that a power plug is formed. An end of each tap edge protruding toward the inner space of the case is electrically connected to the power source board so that AC power of a commercial power source can be supplied to the power source board by inserting the other end of each tap edge into a wall socket.

To a DC output terminal of the power source board, a cable for supplying DC power generated by the power source board to an electronic device is connected. In another side wall of the case, a through hole for passing the cable therethrough is formed. The cable is inserted into the through hole through a bushing formed integrally on an outer circumferential part of the cable. With this structure, the cable extending from the through hole to the outside of the case is prevented from being broken by bending at a proximal end part of the cable. The inner space of the case is filled with resin such that the entire of the power source board is covered with resin. Consequently, the power source board is waterproofed. In general, the case includes an upper case member and a lower case member. After integrating the upper case member and the lower case member by ultrasonic welding, the inner space is filled with resin so that the power source board is made waterproof.

The conventional waterproof case has the above mentioned general structure, and therefore the waterproof property of the case is maintained. However, the conventional waterproof case has a drawback that the case is not able to completely prevent moisture from entering the case via the through hole where the cable is drawn from the case.

In 2004-265748A (Japanese Patent Provisional Publication), the assignee of this application discloses a waterproof structure which is configured such that an injection region is formed on a side wall of a case to have an inner space so that the waterproof property of a through hole for drawing of the cable is enhanced, the through hole is formed to penetrate the injection region from the outside to the inside of the case, resin is injected to cover the cable placed to penetrate the through hole from the outside to the inside of the case at a part of the cable passing the injection region so that the waterproof property of the part of the cable is secured.

If the waterproof structure is configured to have a bushing to prevent breaking of the cable due to bending at the cable drawing part, a problem, that moisture can not be completely prevented from entering the case even if the injection region is filled with resin to secure the waterproof property, arises.

The reason is that although the bushing is formed integrally with an outer sheath of the cable by resin molding, complete integration is impossible and production of a gap between the bushing and the cable can not be avoided because the outer sheath of the cable and the bushing are molded separately. If such a gap is produced, moisture may enter the inside of the case through the gap between an inner circumferential part of the bushing and the outer circumferential part of the cable.

DISCLOSURE OF THE INVENTION

In view of the foregoing various issues, the present invention has been made. An object thereof is to achieve a waterproof case for an electrical apparatus having a cable drawing part configured to enhance a waterproof property of the cable drawing part where a cable is drawn from the waterproof case via a busing.

According to an embodiment of the invention, there is provided a waterproof case for an electrical apparatus, comprising: a case body which includes a first inner space accommodating a functional component, a second inner space adjacent to the first inner space, a first opening connecting the second inner space to the first inner space, a second opening connecting the second inner space to an external space; and a cable located to pass through the first and second openings and to extend from the first inner space to the external space. On an outer circumferential part of the cable, a first bushing member and a second bushing member are located to be spaced with respect to each other while sandwiching a cable exposure part therebetween; each of the first and second bushing members is formed integrally with the outer circumferential part of the cable with no space; the first and second bushing members are located in the second inner space to close the first and second openings, respectively; the outer circumferential part of the cable is exposed to the second inner space at the cable exposure part; and the second inner space is filled with a filling material.

With this configuration, it is possible to secure a waterproof property at a portion where a cable is drawn from a waterproof case and where a conventional structure is not able to secure a sufficient waterproof property. Since the cable having the outer circumferential part on which the bushings have been integrally formed in advance, the number of components can be reduced relative to the conventional structure and therefore the assembling work can be simplified.

The first and second bushing members may respectively have flanges. By providing the flanges larger than the first and second openings, the bushing members are hooked to the case during the assembling work and therefore the assembling work can be eased. The flanges are hard to drop out after the assembling, the waterproof property is also hard to deteriorate.

Each of the flanges may have a plate-like rectangular shape. By this structure, it becomes easier to incorporate the flanges in the case.

The second bushing member may include a boot part formed to extend from the second inner space to the external space while covering the cable. By providing the boot part, it becomes possible to prevent the cable from breaking at a cable drawing part by bending at a small bending radius.

The case body may comprise a pair of case members including a lower case member and an upper case member, and the pair of case members may be integrated by welding at a joint part thereof in a state where the pair of case members have been assembled.

With this configuration, it is possible to form a waterproof case having an excellent waterproof property at a lower cost by easier assembling work. In addition, design and forming of the case is also eased. Therefore, it becomes possible to further reduce the processing cost of the case body.

Optionally, the second inner space may be formed in one of the pair of case members in a state where one of upper and lower sides is opened; and a closing part may be formed on the other of the pair of case members to close the side on which the second inner space is opened.

With this configuration, the assembling work for accommodating the cable and the flanges into the second inner space (box part) can be eased. In addition, it becomes possible to form a sealing structure for the second inner space without increase of the number of components.

Optionally, the closing part may include a projected part which enters the second inner space to reduce an effective volume of the second inner space.

With this configuration, it becomes possible to decrease the use amount of the filling material required for filling the second inner space and thereby to reduce the material cost and the processing time. It is also possible to suppress occurrence of distortion of the filling material due to thermal expansion, and to achieve the waterproof case having more stable waterproof property.

Optionally, the projected part may interfere with the cable to prevent rotation of the cable. For example, the projected part may prevent rotation of the cable by pressing the cable.

With this configuration, it is possible to prevent a problem that, due to rotation of the cable before hardening of the filling material, a gap is formed between the filling material and a surface of the outer sheath of the cable and thereby the waterproof property decreases.

A dam rib may be formed on an inside of the joint part of one of the pair of case members such that the dam rib faces an inner surface of a side wall of the one of the pair of case members and protrudes in a direction in which the other of the pair of case members is joined. A fitting edge may be formed on the other of the pair of case members to fit into a fitting gap formed between the dam rib and the inner surface of the side wall of the one of the pair of case members. The fitting edge may be fitted into the fitting gap in a state where the fitting gap is filled with a sealing material so that a region where the fitting edge is fitted into the fitting gap is sealed.

With this configuration, it is possible to further enhance the waterproof property of the joint part of the case body.

The waterproof case may further include an AC plug including a pair of tap edges provided integrally with the case body to penetrate through a side wall of the case body.

With this configuration, a waterproof case for an electrical apparatus of a direct plug-in type having an excellent waterproof property can be achieved.

According to an embodiment of the invention, there is provided an AC adapter, comprising: a waterproof case for an electrical apparatus according to claim 12; and a power source board corresponding to the functional component. AC input terminals of the power source board are electrically connected to the pair of tap edges of the AC plug, a DC output terminal of the power source board is electrically connected to an end of the cable, and the other end of the cable is connected to an external device to supply DC power generated by the power source board to the external device.

With this configuration, a waterproof case for an electrical apparatus of a direct plug-in type having an excellent waterproof property can be achieved.

According to an embodiment of the invention, there is provided a bushing member configured such that first and second bushing members are integrated and can be separated easily.

By employing such a bushing member in the waterproof case according to an embodiment of the invention, it is possible to form a waterproof case having an excellent waterproof property by easier assembling work without increasing the number of components to be assembled.

According to an embodiment of the invention, there is provided a method of assembling a waterproof case for an electrical apparatus, comprising: a step of mounting a functional component in a first inner space formed in a first case member; a step of connecting an end of a cable configured to have first and second bushing members spaced with respect to each other at a predetermined interval on an outer circumferential part of the cable with no space, to the functional component; a step of inserting the cable to pass through a first opening connecting the first inner space and a second inner space formed in the first case and a second opening connecting the second inner space to an external space so that the cable extends from the first inner space to the external space and that the first and second bushing members formed integrally with the outer circumferential part of the cable are located in the second inner space to close the first and second openings, respectively; a step of filling the second inner space with a filling material; and a step of combining the first case member and a second case member and joining them together to be integrated with each other.

With this assembling method, it is possible to form a waterproof case having an excellent waterproof property at a lower cost.

With this configuration, it is possible to form a waterproof case having an excellent waterproof property at a lower cost by easier assembling work, without increasing the number of molded components to be employed relative to the conventional structure.

BEST MODE FOR CARRYING OUT THE INVENTION

Figure 1:
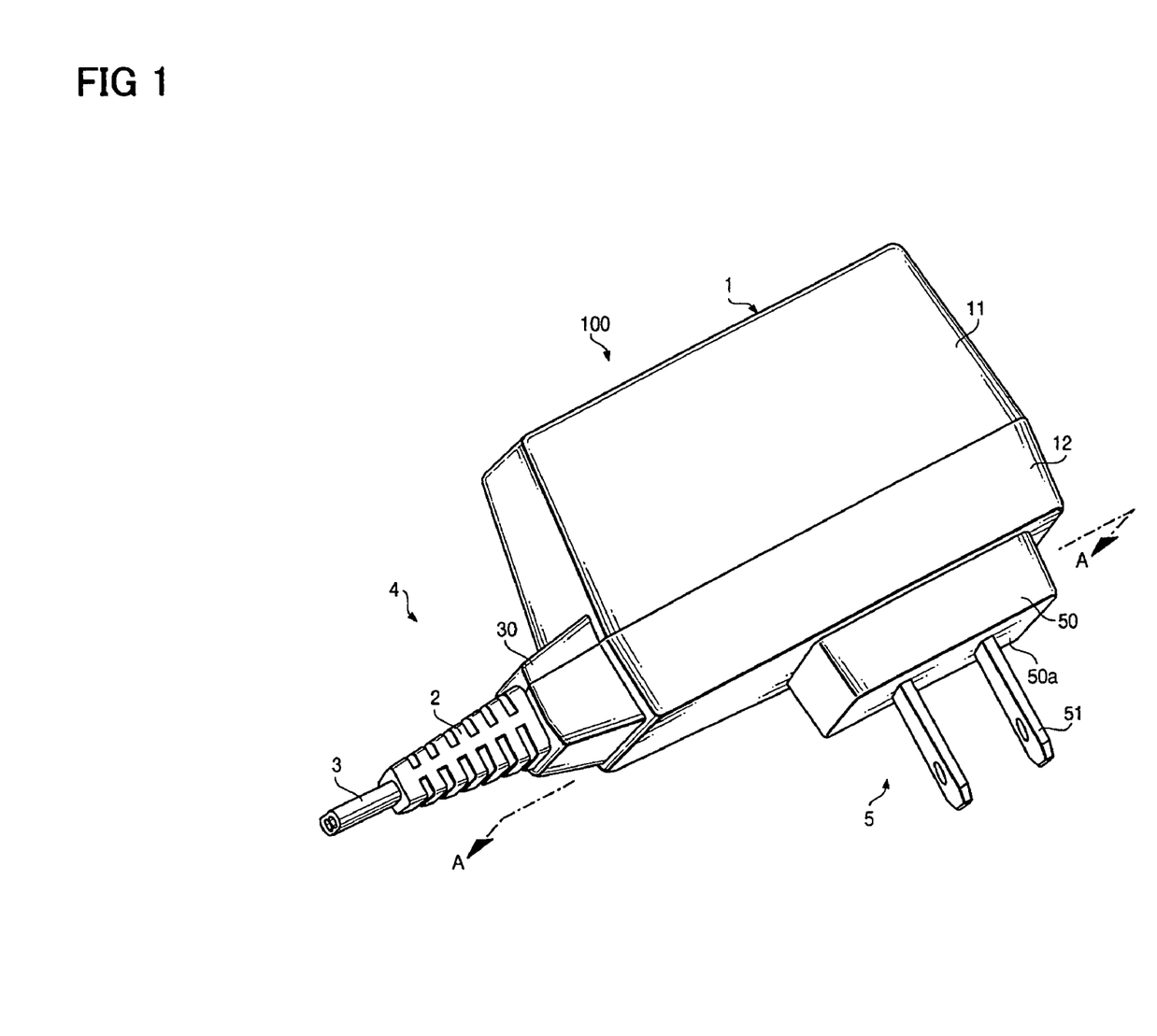
FIG. 1 is a perspective view of an AC adapter employing a waterproof case for an electrical apparatus according to an embodiment of the invention.
Figure 2:
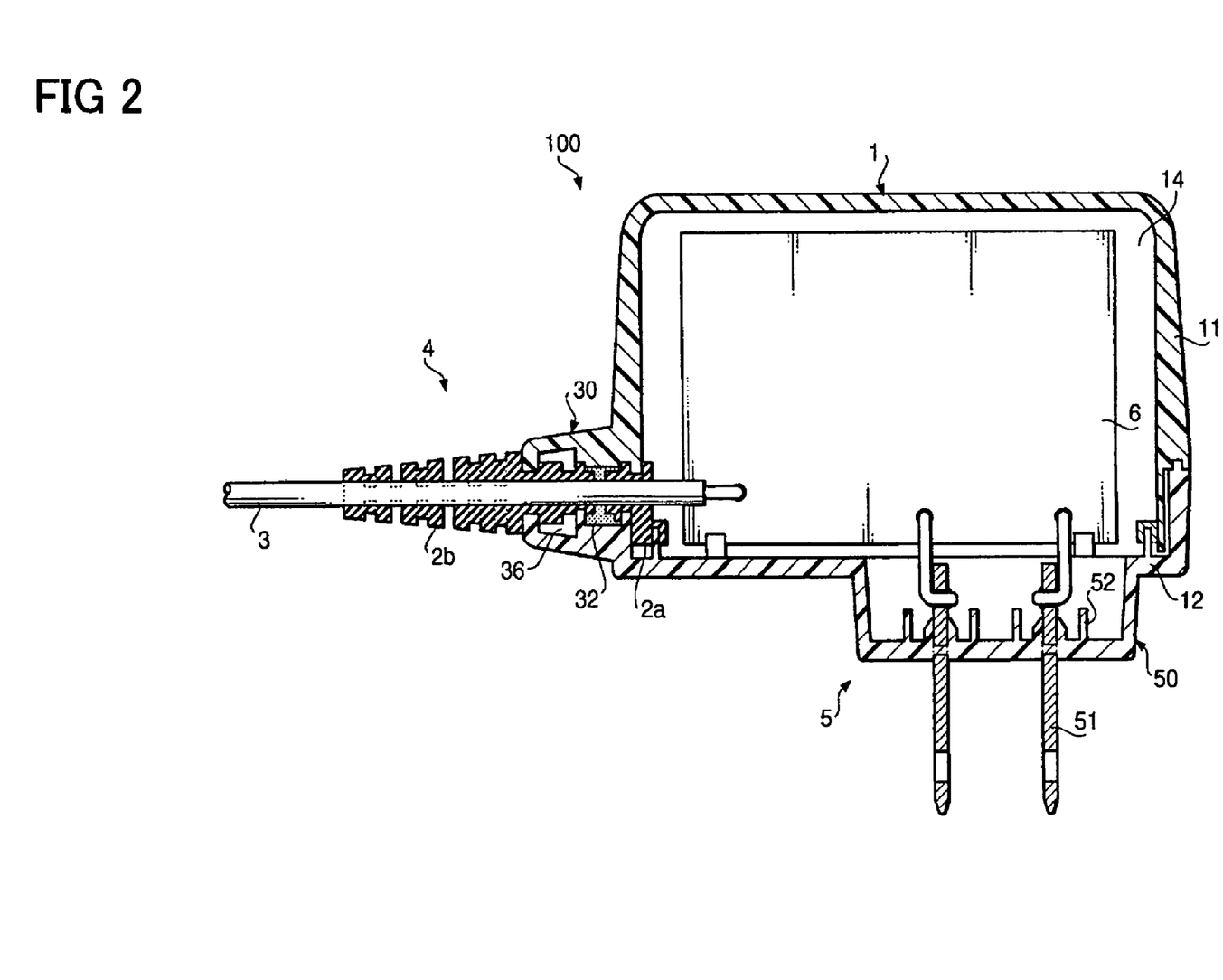
FIG. 2 is a cross section of the AC adapter shown in FIG. 1 along a line A-A.
Figure 3:
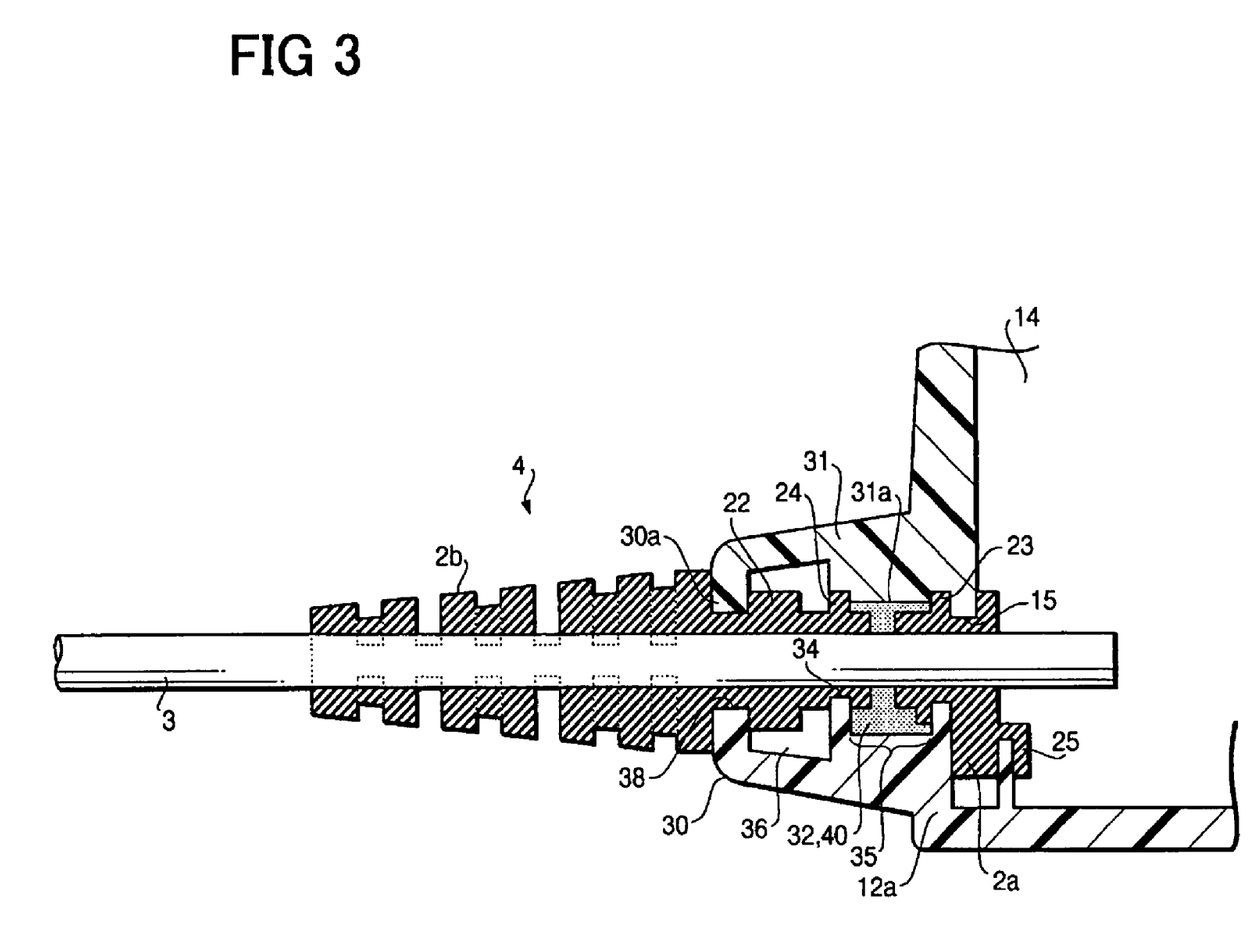
FIG. 3 is an enlarged view of a cable drawing part in FIG. 2.

Hereinafter, embodiments of the present invention are described with reference to the accompanying drawings. FIG. 1 is a perspective view of an AC adapter 100 according to an embodiment of the invention. FIG. 2 is a cross-sectional view of FIG. 1 along a line A-A, and FIG. 3 is an enlarged view of a cable drawing part 4 shown in FIG. 2.

The AC adapter 100 is an electric apparatus to convert AC power from a commercial power source into DC power, and includes a waterproof case 1 having a power source board therein, and a cable 3 which extends from a side wall of the waterproof case 1 to be connected to an electronic device (not shown). On a side wall of the waterproof case 1, a plug part 5 is formed to be connectable to a wall socket so that a direct plug-in scheme where a main body (the waterproof case 1) of an AC adapter can be directly inserted into a wall socket is achieved.

As shown in FIGS. 1 and 2, the waterproof case 1 includes a pair of case bodies (an upper case 11 and a lower case 12). The pair of case bodies forming the waterproof case 1 are molded parts formed of synthetic resin having a heat resisting property and an insulation property.

In a first inner space 14 of the waterproof case 1, a power source board 6 on which electric parts (not shown) for converting commercial AC power to DC power are mounted is incorporated at a predetermined position.

On a side wall of the waterproof case 1, a projected part 50 is formed such that a pair of tap edges 51 forming a plug part penetrates therethrough. Ends of the pair of tap edges protruding toward the inside from a side wall 50a of the projected part 50 are electrically connected to input terminals of the power source board 6 via wires. The tap edges 51 may be directly connected to the power source board 6 by soldering.

The other ends of the tap edges 51 projecting toward the outside from the side wall 50a are configured to be connectable to a wall socket so that commercial power can be supplied to the power source board 6.

Figure 4:
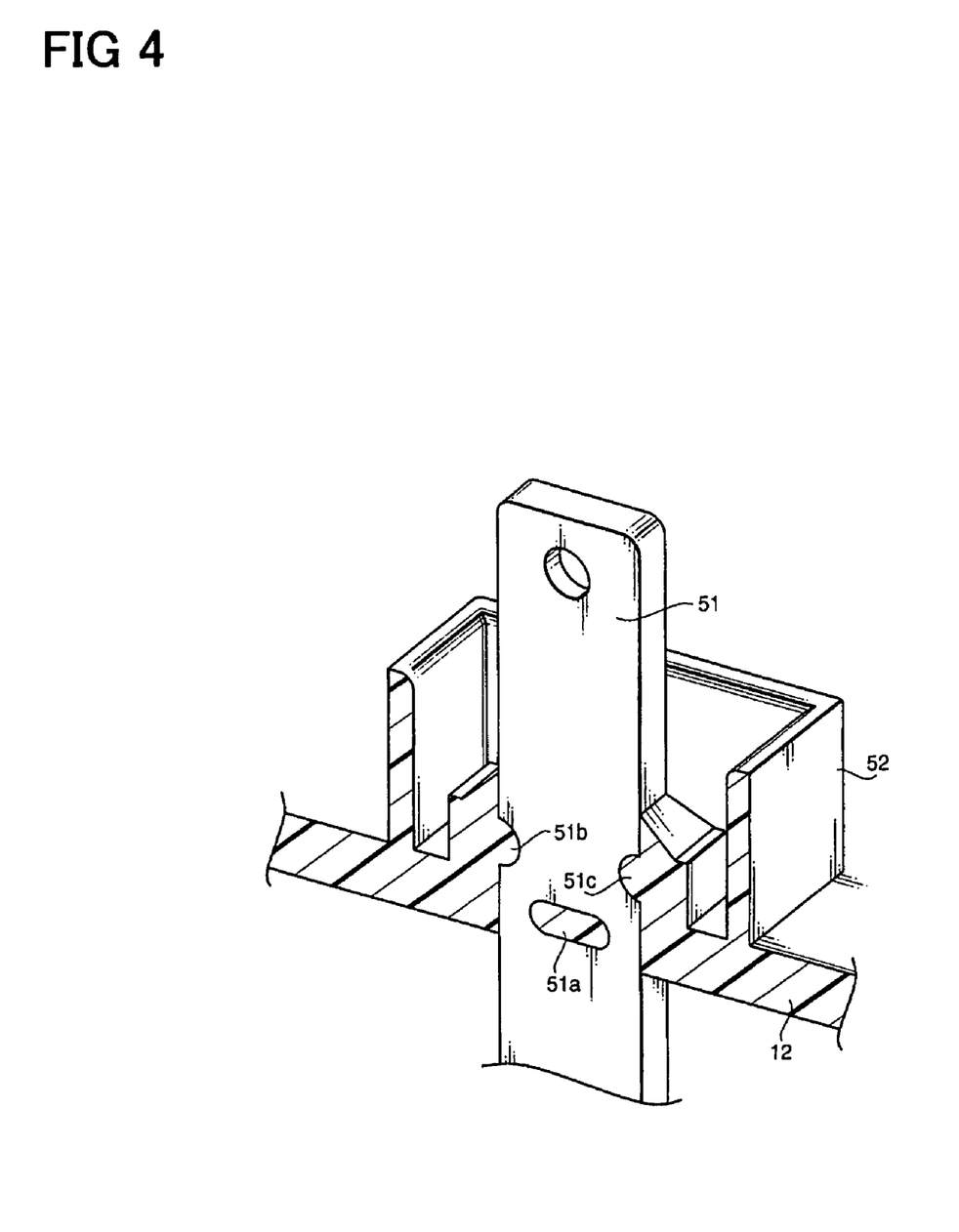
FIG. 4 is a general perspective view illustrating a drawing part of tap edges to the outside of the case in accordance with an embodiment.

As shown in FIG. 4, the tap edges 51 are provided in the lower case 12 by insert molding in a state where the tap edges 51 penetrate through a side wall of the lower case 12 forming the waterproof case 1. With this structure, a gap at a joint part can be minimized and a waterproof property can be secured.

"51a", "51b" and "51c" of FIG. 14 are hooking holes or hooking recesses formed at parts of the tap edge 51. A part of the side wall 50a of the lower case 12 are hooked to these hooking holes or hooking recesses 51a, 51b and 51 during the molding so that the tap edge 51 is held without causing dropping out.

On an inner surface of the side wall 50a around the tap edge 50, a guard wall 52 is formed to protect a part of the tap edge 51 projecting toward the inside from the side wall 50a. A region surrounded by the guard wall 52 is filled with appropriate filling materials (not shown), such as filling resin, so that a waterproof property of this region can be enhanced. With this structure, the waterproof property of the case 1 can be maintained even if a gap is caused at the joint part between the tap edge 51 and the lower case 12 due to temperature increase during use of the AC adapter 100 or a load by falling.

The waterproof case 1 according to the embodiment is provided with an intermediate part 30 formed to protrude a part of a case side wall 12a toward the outside. In the intermediate part 30, a box part 35 having a second inner space 32, and a third inner space 36 surrounding the box part are formed.

The second inner space 32 communicates with the first inner space 14 via a through hole 15, and the third inner space 36 communicates with the second inner space 32 via a through hole 34 and communicates with the outside space via a third through hole 38.

Next, the structure of the cable drawing part 4 is explained. As shown in FIGS. 1 to 3, the cable drawing part 4 includes the intermediate part 30 protruding from a side surface of the waterproof case 1, the cable 3, and a bushing 2 attached integrally to the outer circumferential part of the cable 3. The cable 3 is drawn toward the outside via the first to third through holes 15, 34 and 38 provided in the waterproof case 1 and the busing 2.

Figure 5:
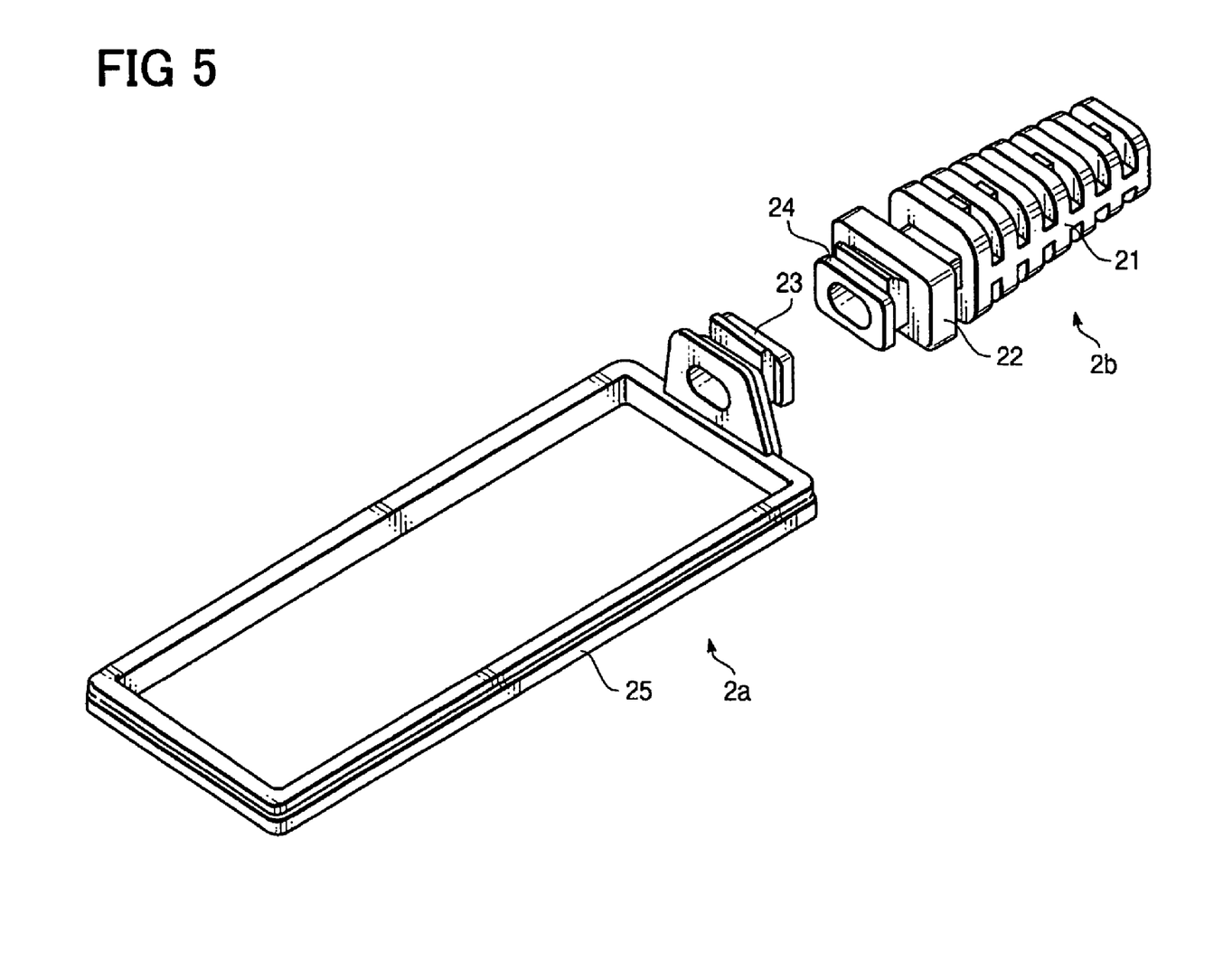
FIG. 5 is a general perspective view of a bushing according to an embodiment.
Figure 6:
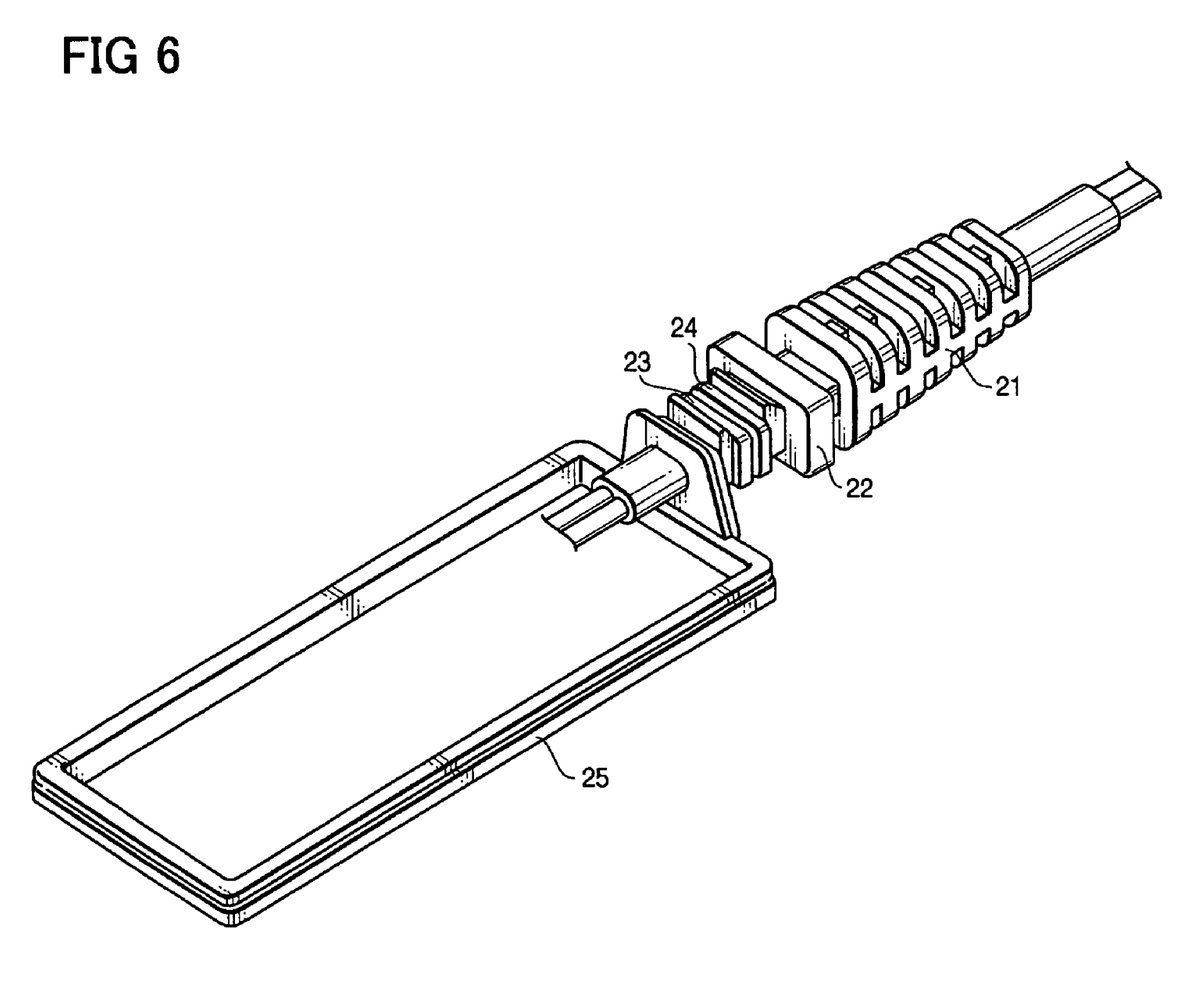
FIG. 6 is a general perspective view of a bushing integrally formed with a cable sheath in accordance with an embodiment of the invention.

Hereafter, the structure of the bushing 2 forming the cable drawing part 4 is explained with reference to FIGS. 5 and 6. The bushing 2 includes two spaced busing members (i.e., a first bushing member 2a and a second bushing member 2b). FIG. 5 illustrates structures of the first and second bushing members 2a and 2b. In FIG. 5, a state where a cable is omitted and the two busing members are separated is illustrated for the purpose of illustration. Actually, since the bushing members are formed integrally with the outer sheath of the cable by injection molding, the bushing members can not be separated from the cable. The first bushing member 2a is configured such that a first flange 23 and a seal 25 are integrally formed. The second bushing member 2b is configured such that a boot 21, a hook 22 and a second flange 24 are integrally formed. FIG. 6 illustrates a state where the bushing members are formed integrally with the cable outer sheath on the cable outer sheath.

The boot 21 has an outer diameter changing uniformly along the longitudinal direction. The boot 21 is positioned outside the waterproof case 1 to serve as a part for protecting the cable from being bent by a bending radius lower than or equal to an acceptable bending radius at a proximal part of the cable drawing part 4. The hook 22 is a rectangular part located in the third inner space 36 provided in the intermediate part 30. Since the hook 22 has a width wider than an opening width of the third through hole provided in a wall part 30a of the intermediate part 30, the hook 22 is hooked to the wall part 30a of the intermediate part 30 so that the cable 3 does not drop out from the waterproof case 1 even if a tension is applied to the cable 3. The first and second flanges 23 and 24 are located in the second inner space 32 of the box part 35 provided in the intermediate part 30, and serves to secure the waterproof property of the cable drawing part 4 by sealing the through holes 15 and 34 for leading the cable to the inside of the waterproof case 1. The seal 25 is located in the first inner space 14 of the waterproof case 1, and serves as a sealing member at a fitting part between the upper case 11 and the lower case 12.

In the busing 2 according to the embodiment of the invention, a cable exposure part where the outer sheath of the cable 3 is exposed to the surrounding space without covering by the bushing 2 is formed between the first flange 23 and the second flange 24.

The cable 3 is placed on the lower case of the waterproof case 1. The cable 3 is placed to be inserted through the through holes 15, 34 and 38 such that the first and second flanges 23 and 24 are located in the second inner space 32, and the hook is located in the third inner pace 36. Then, the second inner space 32 of the box part 35 is filled with the filing resin 40 such that the cable 3 exposed between the first and second flanges 23 and 24 are directly covered. With this structure, even if a gap is formed between the inner circumferential part of the bushing 2 and the outer circumferential part of the cable 3 and thereby moisture enters the inside of the box part passing the gap, entering of the moisture is blocked at this part and the waterproof property of the waterproof case 1 is secured because the region surrounding the exposed part of the cable 3 between the first flange 23 and the second flange 24 is filled with the filling resin 40 with no space in the region. As the filling material 40, resin, such as, epoxy resin or urethane resin, is appropriate.

With the above mentioned structure according to the embodiment of the invention, it is possible to securely achieve the waterproof property to draw the cable 3 from the waterproof case 1. In addition, a plurality of parts having different functions are integrally formed with the outer sheath of the cable on the outer sheath of the cable while allocating positional relationships to these parts for assembling. Consequently, cost for molding of the parts and assembling of the parts can be reduced considerably.

Figure 7:
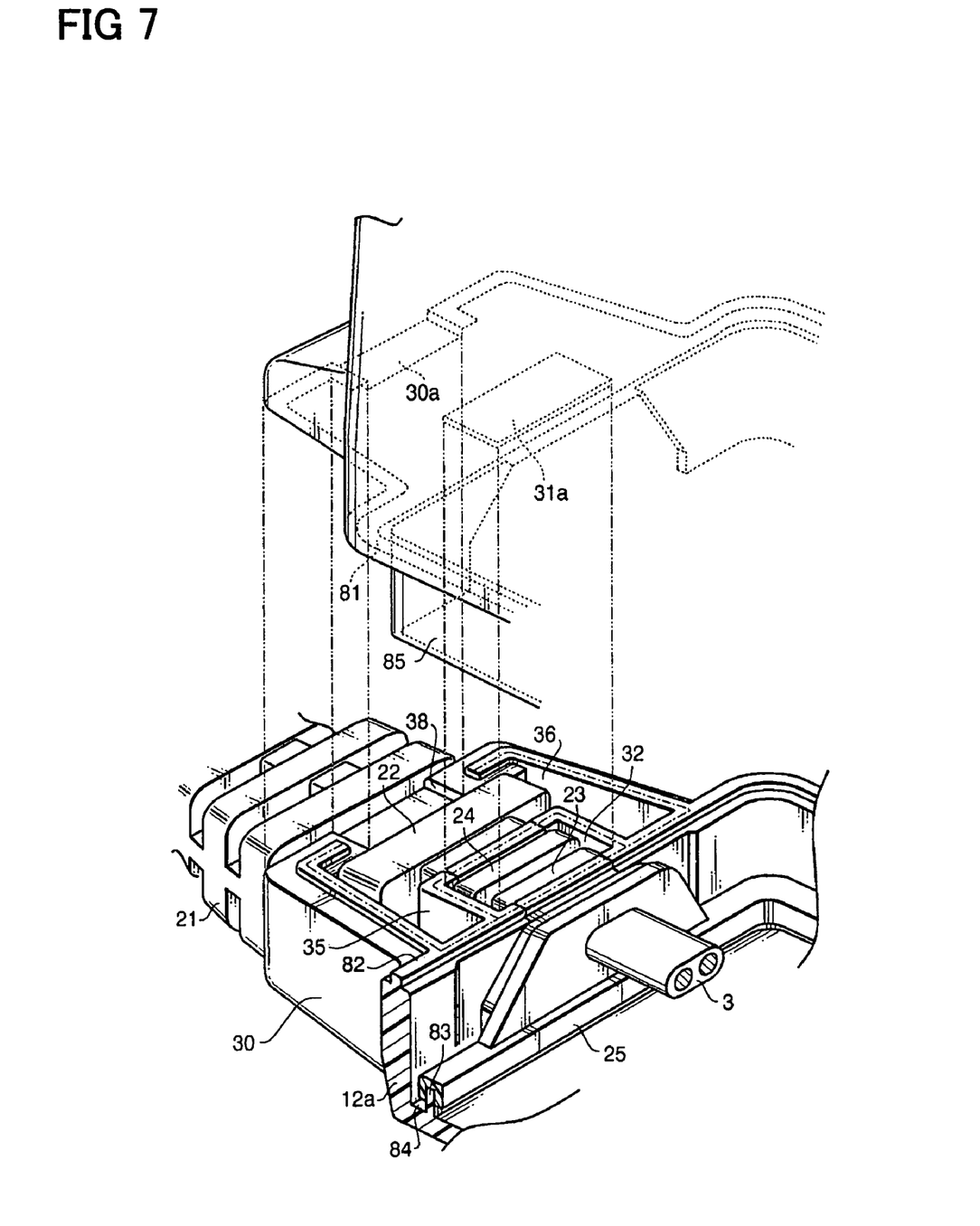
FIG. 7 is a general exploded diagram illustrating a closing structure in an intermediate part of the AC adapter shown in FIG. 1.

In this embodiment, as shown in FIG. 7, a closing part 31 is formed integrally with a part of the upper case 11 to close the upper side opening of the intermediate part 30. On the bottom of the closing part 31, a projected part 31a is formed. The projected part 31a is configured such that the projected part 31a enters the upper region of the second inner space of the box 35 when the upper case 11 and the lower case 12 are combined, and thereby decreases the effective volume of the space surrounded by the box part 35 and the closing part 31 (i.e., the volume into which the filling resign 40 can be injected). Therefore, it is possible to fill the box part 35 with a minimum amount of the filling material 40, and to achieve the secure waterproof property.

In the bush 2 of the cable 3 according to the embodiment, the first and second flanges 23 and 24 are formed to have rectangular flange shapes and to sandwich a rib-like part for supporting the bush 2 therebetween with the flange shapes thereof By filling the space between the first and second flanges 23 and 24 with the filling resin 40, the secure waterproof property is achieved.

If the cable 3 is rotated before the filling material 40 fixes, a gap might be formed in the filling material and the waterproof property is deteriorated. Therefore, it is preferable to provide the closing part 31 with a function of preventing rotation of the cable 3. In this embodiment, the function of preventing rotation of the cable 3 is achieved by sandwiching the rectangular flanges integrally formed with the outer sheath of the cable by the rib-like parts of the box part 35. For another example, the function of preventing rotation of the cable may be achieved by a structure in which the projected part formed on the bottom of the closing part 31 directly contacts the cable to prevent rotation. For example, the bottom surface of the closing part 31 may be situated at a position slightly lower than the top of the cable 3 when the upper and lower cases 11 and 12 are combined, so that the bottom surface of the closing part 31 presses downwardly the cable 3. If the cable 3 has an elliptical shape, by configuring the bottom surface of the closing part 31 to contact the top of the cable 3 in a minor axis direction, the rotation of the cable can be prevented without pressing the cable 3. By forming projections and depressions on the button surface of the closing part 31 by a knurling process and the like, rotation of the cable 3 can be prevented more effectively.

On the top of the rib-like part forming the opening of the intermediate part 35, a rib for ultrasonic welding is formed. The rib for ultrasonic welding serves to achieve the secure welding between the lower case and the closing part 31, and additionally serves as a dam preventing flowing out of the filling material 40 before the filling material 40 injected into the box part 35 fixes.

Figure 9A:
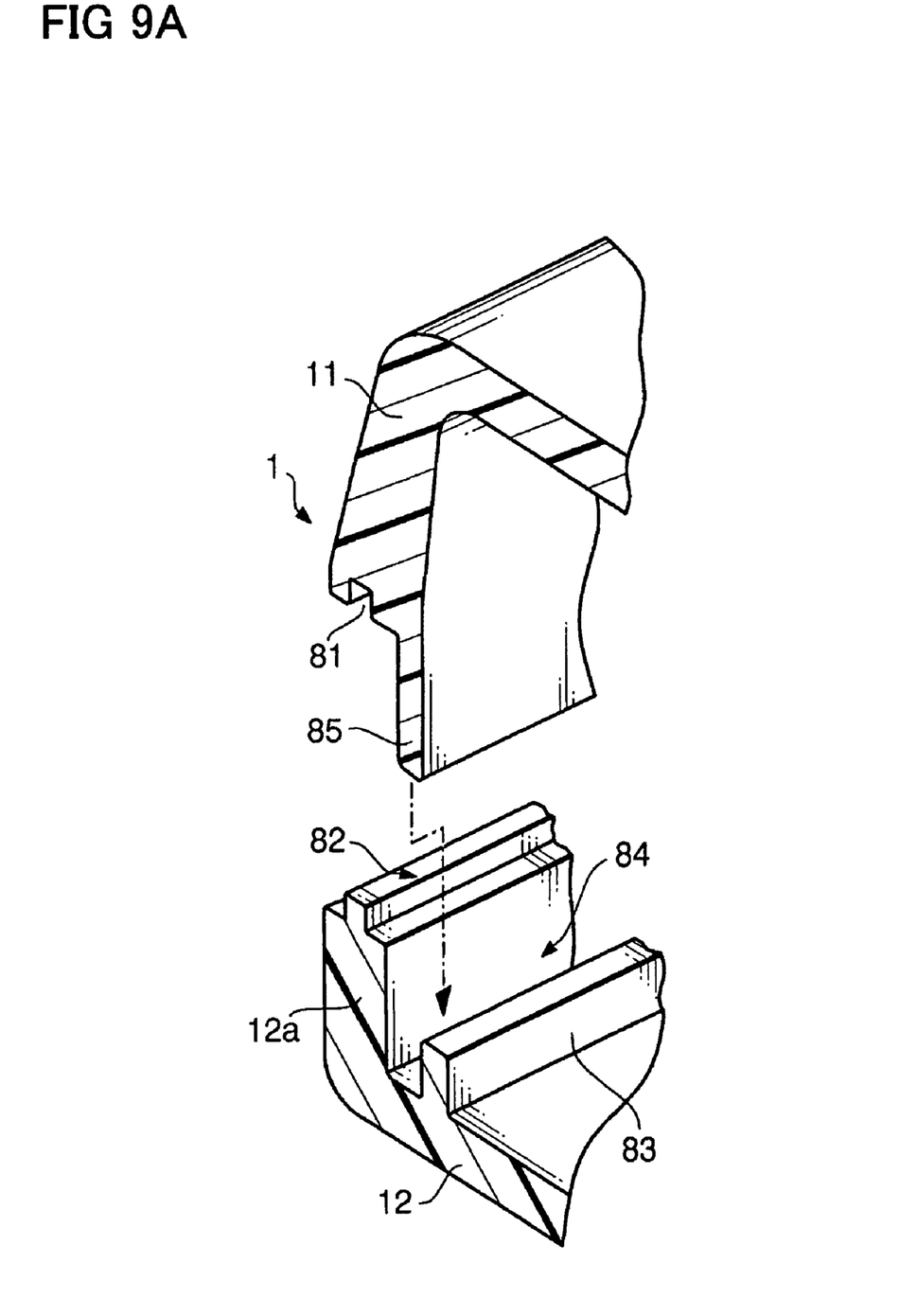
FIG. 9A is a general exploded perspective view illustrating a waterproof structure at a joint part in accordance with an embodiment of the invention.
Figure 9B:
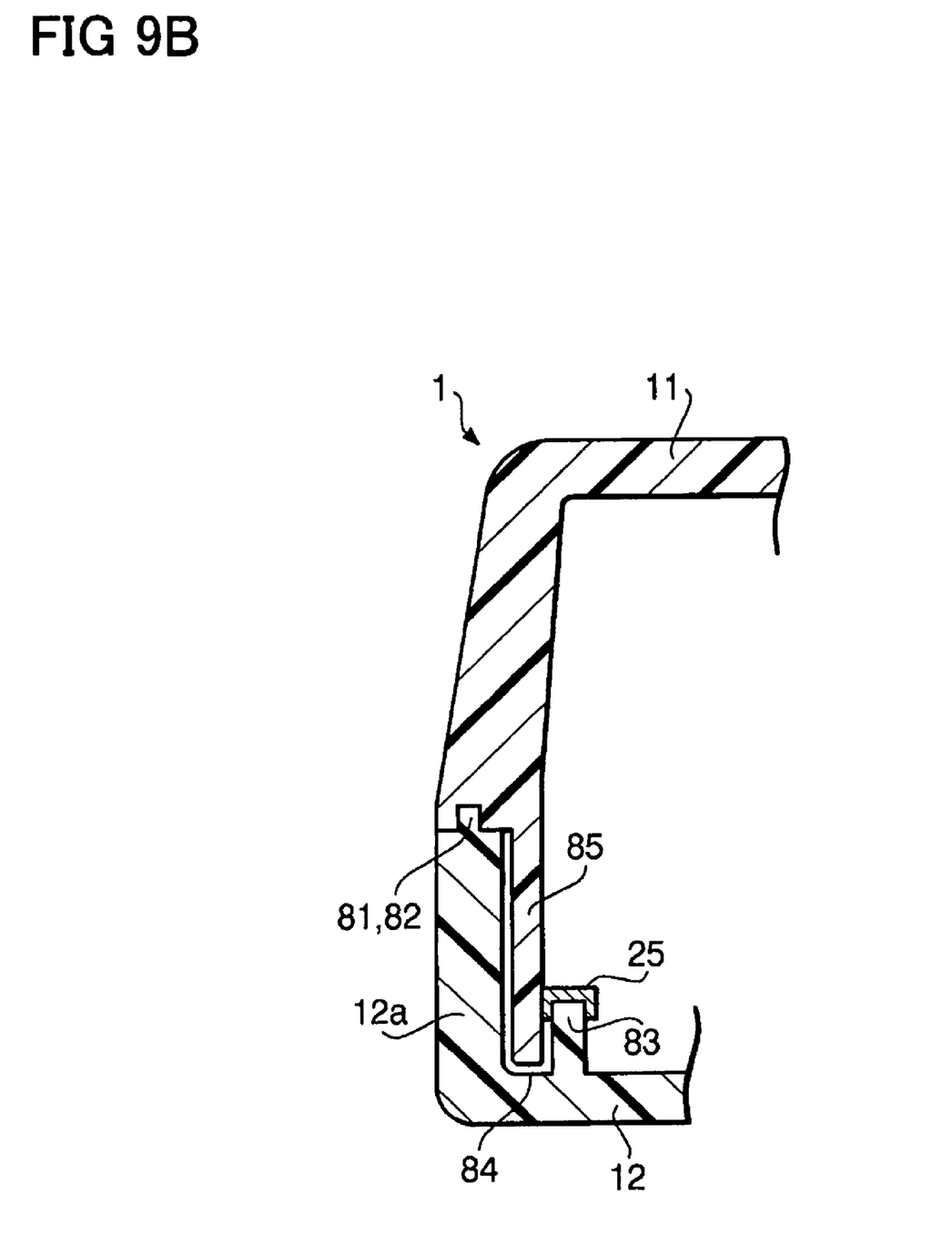
FIG. 9B is a general side cross section illustrating the waterproof structure at the joint part in accordance with an embodiment of the invention.

In this embodiment, the waterproof case 1 is configured by combining a pair of upper and lower cases 11 and 12 in a required state and welding a joint part by ultrasonic welding and the like. As shown in FIGS. 9A-9B, the joint parts of the upper and lower cases 11 and 12 are integrally welded while keeping the secure waterproof property, by fitting a depression 81 to a projection 82 and welding the joint parts.

As shown in FIGS. 9A and 9B, on the inside of the joint part of the upper and lower case 11 and 12, a dam rib 83 is formed to protrude upwardly from the inner bottom surface of the lower case 12. The dam rib 83 faces the inner surface of the side wall 12a of the case 12 while keeping a slight interval with respect to the inner surface of the side wall 12a.

Figure 8:
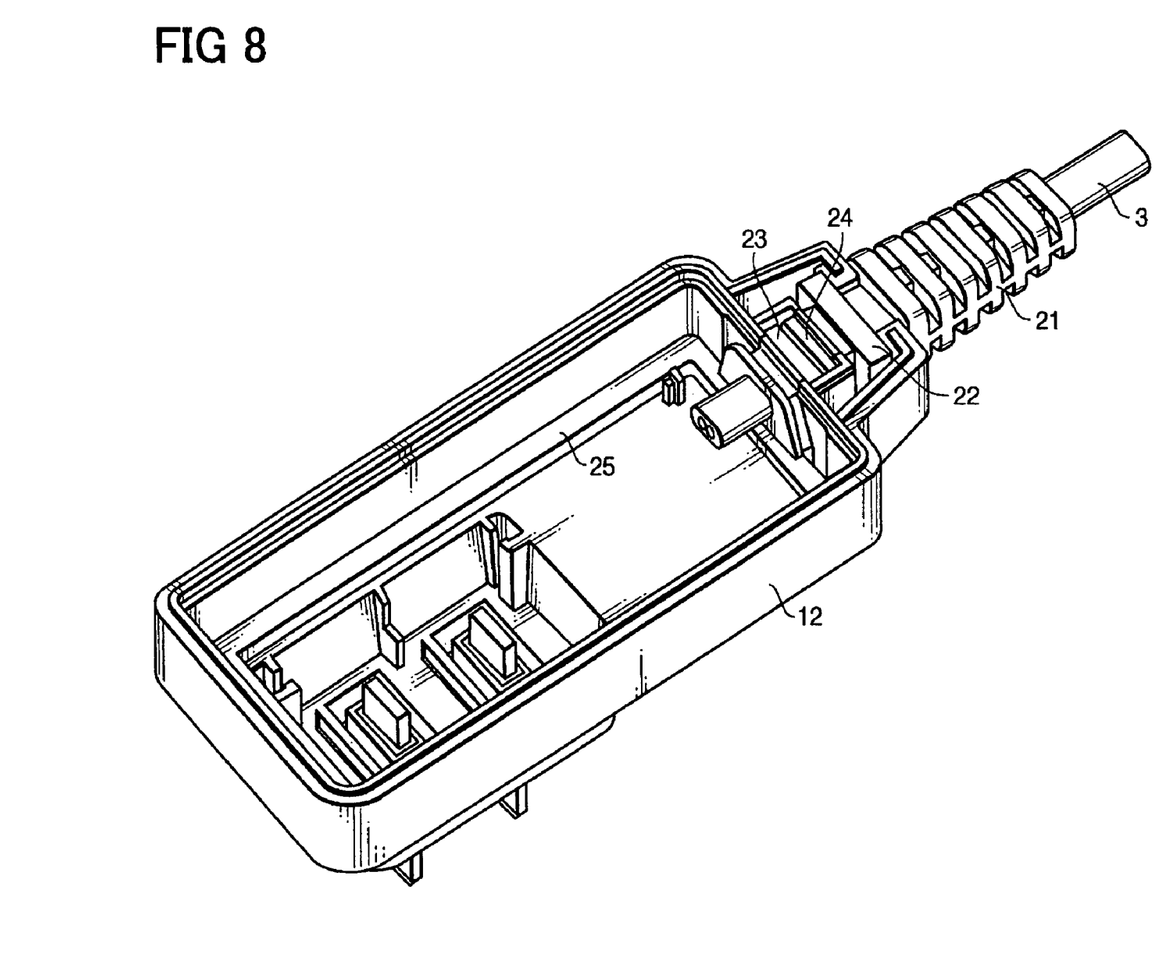
FIG. 8 is a general perspective view of a lower case member to which the busing is mounted in accordance with an embodiment of the invention.
Figure 9C:
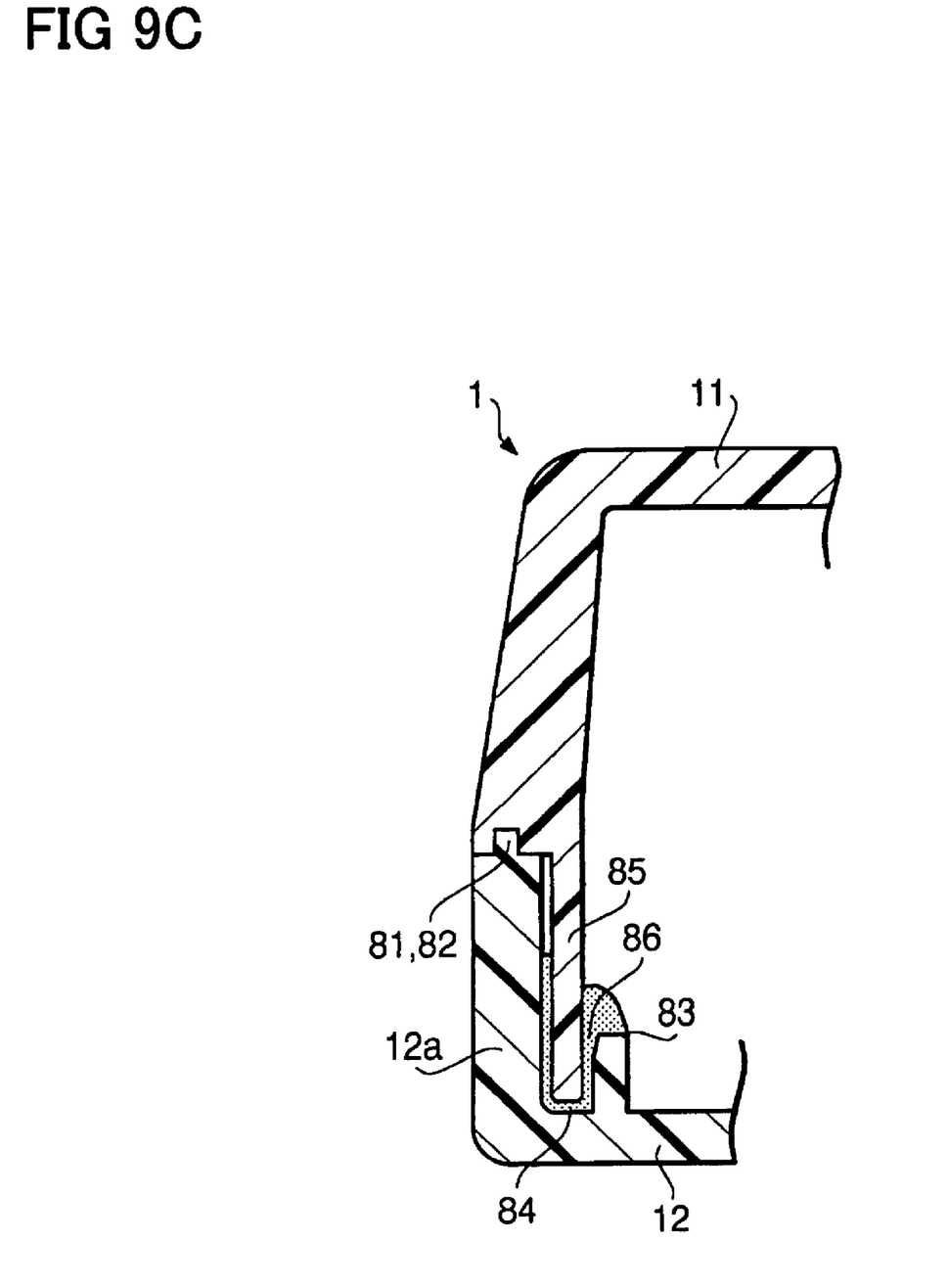
FIG. 9C is a general side cross section illustrating another waterproof structure at the joint part in accordance with an embodiment of the invention.

A fitting edge 85 is formed on the upper case 11 to fit into a fitting gap 84 formed between the inner surface of the side wall 12a of the lower case 12 and the dam rib 83. The seal 25 of the first busing member 2a having a loop-like shape is configured to have a rectangular groove, along the loop, at a center in a width direction of the bottom surface of the loop. As shown in FIG. 9B, the seal 25 has a cross section having a shape of a letter "U". The width of the groove and the loop shape of the seal 25 match the width of the top and the extended shape of the loop shape of the dam rib 83. That is, as shown in FIG. 9B, the groove of the seal 25 fits to the top of the dam rib 83 with no space between them. By fitting the fitting edge 85 of the upper case 11 into the fitting gap 84 in a state where the seal 25 is fitted to the top of the dab rib 83 of the lower case 12 (see FIG. 8), the seal 25 also closely contacts with the fitting edge 85 along the entire side surface of the fitting edge 85 with no space between them. With this structure, the waterproof property between the upper and lower cases 11 and 12 can be secured, and therefore the waterproof property of the waterproof case 1 from which the cable 3 is drawn is secured. As shown in FIG. 9C, the fitting gap 84 may be sealed by a sealing material 86 without forming the seal 25 on the first bushing member 2a. The sealing material 86 may be used together with the seal 25 to further enhance the waterproof property. As the sealing material, epoxy resin or urethane resin is appropriate.

The AC adapter 100 according to the embodiment is assembled as follows. First, the power source board 6 is attached to the lower case 12 of the waterproof 1. Next, the cable 3 having the outer sheath on which the busing 2 is integrally formed is inserted into the through holes 15, 34 and 38 formed in the intermediate part 30, the hook of the second bushing 2b is placed in the inner space of the intermediate part 30, and the first flange 23 of the first bushing 2a and the second flange 24 of the second bushing 2b are respectively placed at predetermined positions in the second inner space of the box part 35 to close the first and second through holes 15 and 34, respectively.

After the fitting gap is filled with sealing material, the seal 25 of the first bushing 2a is fitted to the top of the dam rib 83 of the lower case 23. Then, an end of the cable 3 inserted in the inner space through the through hole 15 is connected to an AC input terminal of the power source board 6. Then, the tap edge 51 formed in the lower case 12 by insert molding is connected to a DC output terminal of the power source board 6.

After connections are finished, the filling material 40 is injected into the second inner space of the box part 35 by a predetermined amount from the upward opening. As the filling material, epoxy resin or urethane resin is appropriate. Next, the lower case 12 is covered with the upper case 11, and the upper case 11 and the lower case 12 are integrated by ultrasonic welding and the like.

The present invention is not limited to those shown in the above described structure, and the shapes and structures of the components forming the cable drawing part may be changed. For example, although in the above mentioned embodiment the closing part 31 closing the opening of the intermediate part 30 is formed in the upper case 11, an embodiment in which only the filling material 40 is injected into the inner space of the box part 35 may be made.

The embodiment is described with respect to the AC adapter; however, the invention is not limited to the above described embodiment, and can be applied to waterproof cases of apparatus or devices which have functional components, such as electric and electronic parts and have the need for drawing a cable therefrom so that the advantages can be achieved. The cable is not limited to the power cable, and may be an electrical cable or an optical cable for communication. The shapes and the number of tap edges are not limited to plate-like members shown in the above mentioned embodiment, but the number of tap edges may be larger than or equal to three, the shape of the tap edge may have a different shape such as a rod-like shape.

What is claimed is:

1. A waterproof case for an electrical apparatus, comprising:
    a case body which includes a first inner space accommodating a functional component, a second inner space adjacent to the first inner space, a first opening connecting the second inner space to the first inner space, a second opening connecting the second inner space to an external space; and
    a cable located to pass through the first and second openings and to extend from the first inner space to the external space,
    wherein:
    on an outer circumferential part of the cable, a first bushing member and a second bushing member are located to be spaced with respect to each other while sandwiching a cable exposure part therebetween;
    each of the first and second bushing members is formed integrally with the outer circumferential part of the cable with no space;
    the first and second bushing members are located in the second inner space to close the first and second openings, respectively;
    the outer circumferential part of the cable is exposed to the second inner space at the cable exposure part; and
    the second inner space is filled with a filling material.

2. The waterproof case for an electrical apparatus according to claim 1, wherein the first and second bushing members respectively have flanges.

3. The waterproof case for an electrical apparatus according to claim 2, wherein each of the flanges has a plate-like rectangular shape.

4. The waterproof case for an electrical apparatus according to claim 1, wherein the second bushing member includes a boot part formed to extend from the second inner space to the external space while covering the cable.

5. The waterproof case for an electrical apparatus according to claim 1,
    wherein:
    the case body comprises a pair of case members including a lower case member and an upper case member; and
    the pair of case members are integrated by welding at a joint part thereof in a state where the pair of case members have been assembled.

6. The waterproof case for an electrical apparatus according to claim 5,
    wherein:
    the second inner space is formed in one of the pair of case members in a state where one of upper and lower sides is opened; and
    a closing part is formed on the other of the pair of case members to close the side on which the second inner space is opened.

7. The waterproof case for an electrical apparatus according to claim 6, wherein the one of the pair of case members is the lower case member.

8. The waterproof case for an electrical apparatus according to claim 6, wherein the closing part includes a projected part which enters the second inner space to reduce an effective volume of the second inner space.

9. The waterproof case for an electrical apparatus according to claim 8, wherein the projected part interferes with the cable to prevent rotation of the cable.

10. The waterproof case for an electrical apparatus according to claim 9, wherein the projected part prevents rotation of the cable by pressing the cable.

11. The waterproof case for an electrical apparatus according to claim 5,
    wherein:
    a dam rib is formed on an inside of the joint part of one of the pair of case members such that the dam rib faces an inner surface of a side wall of the one of the pair of case members and protrudes in a direction in which the other of the pair of case members is joined;
    a fitting edge is formed on the other of the pair of case members to fit into a fitting gap formed between the dam rib and the inner surface of the side wall of the one of the pair of case members; and
    the fitting edge is fitted into the fitting gap in a state where the fitting gap is filled with a sealing material so that a region where the fitting edge is fitted into the filling gap is sealed.

12. The waterproof case for an electrical apparatus according to claim 1, further comprising an AC plug including a pair of tap edges provided integrally with the case body to penetrate through a side wall of the case body.

13. An AC adapter, comprising:
    a waterproof case for an electrical apparatus according to claim 12; and
    a power source board corresponding to the functional component,
    wherein:
    AC input terminals of the power source board are electrically connected to the pair of tap edges of the AC plug;
    a DC output terminal of the power source board is electrically connected to an end of the cable; and
    the other end of the cable is connected to an external device to supply DC power generated by the power source board to the external device.

14. A method of assembling a waterproof case for an electrical apparatus, comprising:
    a step of mounting a functional component in a first inner space formed in a first case member;
    a step of connecting an end of a cable configured to have first and second bushing members spaced with respect to each other at a predetermined interval on an outer circumferential part of the cable with no space, to the functional component;
    a step of inserting the cable to pass through a first opening connecting the first inner space and a second inner space formed in the first case and a second opening connecting the second inner space to an external space so that the cable extends from the first inner space to the external space and that the first and second bushing members formed integrally with the outer circumferential part of the cable are located in the second inner space to close the first and second openings, respectively;

a step of filling the second inner space with a filling material; and a step of combining the first case member and a second case member and joining them together to be integrated with each other.

* * * * *